United States Patent
Zambrano

(10) Patent No.: US 6,218,228 B1
(45) Date of Patent: *Apr. 17, 2001

(54) DMOS DEVICE STRUCTURE, AND RELATED MANUFACTURING PROCESS

(75) Inventor: Raffaele Zambrano, San Giovanni La Punta (IT)

(73) Assignee: Consorzio per la Ricerca sulla Microelettronica nel Mezzogiorno, Catania (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/856,261

(22) Filed: May 14, 1997

Related U.S. Application Data

(62) Division of application No. 08/622,695, filed on Mar. 26, 1996, now Pat. No. 5,838,042.

(30) Foreign Application Priority Data

Mar. 31, 1995 (EP) .................................................. 95830121

(51) Int. Cl.$^7$ ................................................ H01L 21/8238
(52) U.S. Cl. ......................... 438/229; 438/232; 438/301; 438/306
(58) Field of Search .................... 438/270, 199, 438/229, 232, 301, 306, 268; 257/328, 342, 139

(56) References Cited

U.S. PATENT DOCUMENTS

| | | | |
|---|---|---|---|
| 3,798,084 | * 3/1974 | Lyons | 148/189 |
| 4,376,286 | 3/1983 | Lidow et al. | 357/23 |
| 4,593,302 | 6/1986 | Lidow et al. | 257/342 |
| 4,613,883 | 9/1986 | Tihanvi | 357/23.4 |
| 4,644,637 | 2/1987 | Temple | 29/571 |
| 4,774,198 | 9/1988 | Contiero et al. | 437/30 |
| 4,884,113 | 11/1989 | Muramoto | 357/23.4 |
| 4,928,155 | 5/1990 | Nakagawa et al. | 257/341 |
| 4,974,059 | 11/1990 | Kinzer | 257/342 |
| 4,975,751 | 12/1990 | Beasom | 357/13 |
| 5,338,693 | 8/1994 | Kinzer et al. | 437/29 |
| 5,382,538 | 1/1995 | Zambrano et al. | 437/44 |
| 5,442,214 | * 8/1995 | Yang | 257/328 |
| 5,479,037 | * 12/1995 | Hshieh et al. | 257/328 |
| 5,532,179 | * 7/1996 | Chang et al. | 437/40 |
| 5,661,312 | * 8/1997 | Weitzel et al. | 257/77 |
| 5,679,966 | * 10/1997 | Baliga et al. | 257/139 |

FOREIGN PATENT DOCUMENTS

| | | | |
|---|---|---|---|
| 2 243 952 | 11/1991 | (GB) | H01L/29/06 |
| 1-59959 | 3/1989 | (JP) | 257/342 |

OTHER PUBLICATIONS

European Search Report from European Patent Application No. 95830121.0, filed Mar. 31, 1995.

* cited by examiner

Primary Examiner—John F. Niebling
Assistant Examiner—Christopher Lattin
(74) Attorney, Agent, or Firm—Wolf, Greenfield & Sacks, P.C.; James H. Morris; Theodore E. Galanthay

(57) ABSTRACT

A DMOS device structure includes a lightly doped semiconductor layer of a first conductivity type, a plurality of lightly doped semiconductor regions of a second conductivity type extending from a top surface of the lightly doped semiconductor layer thereinto, source regions of the first conductivity type contained in the lightly doped semiconductor regions and defining channel regions. The lightly doped semiconductor regions are contained in respective enhancement regions of the lightly doped semiconductor layer of the same conductivity type as, but with a lower resistivity than, the lightly doped semiconductor layer.

7 Claims, 2 Drawing Sheets

DMOS DEVICE STRUCTURE, AND RELATED MANUFACTURING PROCESS

This application is a division of application Ser. No. 08/622,695, filed Mar. 26, 1996 now U.S. Pat. No. 5,888,042, entitled DMOS DEVICE STRUCTURE, AND RELATED MANUFACTURING PROCESS now pending.

BACKGROUND OF THE INVENTION

1. Field of the Invention

The present invention relates to an improved structure for Double-diffused MOS-technology (DMOS) devices (such as DMOSFETs, Vertical DMOSFETs or "VDMOSFETs", IGBTs etc.), and to a related manufacturing process.

2. Discussion of the Related Art

A power VDMOSFET is a device including, integrated in the same semiconductor chip, several hundred or even thousands elementary cells representing elementary VDMOSFETs connected in parallel in order to contribute a given fraction to the overall current of the power device.

In its simplest form, each elementary cell includes a first region of a given conductivity type (P type for an N-channel device, N type for a P-channel one) formed inside a lightly doped semiconductor layer of the opposite conductivity type (N type or P type, respectively); the lightly doped layer is formed over a heavily doped semiconductor substrate of the same conductivity type, in the case of VDMOSFETs, or of the opposite conductivity type in the case of IGBTs. The first region includes a heavily doped deep body region surrounded by a more lightly doped body region. An annular source region is formed inside the body and deep body regions.

A manufacturing process for an N-channel VDMOSFET is described in "Power MOSFETs: Power for the 80s", D. Grant and A. Tregida, Solid State Technology, November 1985, which is incorporated herein by reference. The process provides for epitaxially growing a lightly doped N type silicon layer over a heavily doped silicon substrate; performing a field oxidation; forming the heavily doped deep body regions; defining active areas of the device; growing a gate oxide layer over said active areas; depositing and doping a polysilicon layer over the gate oxide layer; defining gate regions by selectively etching the polysilicon layer; forming the body regions and the source regions to define the channel of the VDMOSFET; depositing an oxide layer over the entire surface of the chip; defining contact areas in said oxide layer; forming metal layers on the top and bottom surfaces of the chip; and passivating the top surface of the chip.

More evolved VDMOSFET structures are described in the U.S. Pat. No. 5,382,538 and U.S. Pat. No. 4,774,198, both incorporated herein by reference.

For example, in the U.S. Pat. No. 5,382,538 a structure is described wherein the heavily doped deep body regions are formed inside the more lightly doped body regions, and are self-aligned with the polysilicon gate (and thus with the channel regions). A manufacturing process suitable for obtaining this structure differs from the previously described process in that both the lightly doped body regions and the heavily doped deep body regions are formed in a self-aligned manner with the polysilicon gates, and the lightly doped body regions are formed first.

A major problem of power VDMOSFETs is that the lightly doped epitaxial layer, having a significant resistivity, causes the power device to have a high on-state resistance RDSon (the resistance value between drain and source terminals when the device is in the conductive state). High RDSon values result in significant power dissipation.

Furthermore, it is known that power VDMOSFETs which must withstand high drain-source voltages require highly resistive and thick epitaxial layers, and that the RDSon value increases rapidly with the breakdown voltage BV.

In the U.S. Pat. No. 4,974,059 a high power MOSFET structure is disclosed which is substantially similar to the structure described in the already mentioned U.S. Pat. No. 5,382,538, but in which the regions between the elementary cells have the same conductivity type of the epitaxial layer but lower resistivity reducing the RDSon value of the power MOSFET. All these regions are continuous and shallower than the body regions of the VDMOSFET elementary cells.

In view of the state of the art described, it is an object of the present invention to provide a DMOS device structure which allows a reduction of the on-state resistance without affecting the breakdown voltage value.

SUMMARY OF THE INVENTION

According to the present invention, these and other objects are attained by means of a device structure comprising a lightly doped semiconductor layer of a first conductivity type, a plurality of lightly doped semiconductor regions of a second conductivity type extending from a top surface of the lightly doped semiconductor layer thereinto, source regions of the first conductivity type contained in the lightly doped semiconductor regions and defining channel regions, wherein said lightly doped semiconductor regions are contained in respective enhancement regions of the lightly doped semiconductor layer of the same conductivity type as, but with a lower resistivity than, the lightly doped semiconductor layer.

As a result of the present invention, it is possible to reduce the on-state resistance RDSon of a DMOS-technology power device: in fact, the presence of the enhancement regions around the lightly doped body regions reduces the major components of RDSon, such as the JFET component Rjfet. Such a reduction in the RDSon is not obtained at the expense of a reduction in the breakdown voltage: on the contrary, experimental tests have shown that the presence of the enhancement regions increases the breakdown voltage of the device.

BRIEF DESCRIPTION OF THE DRAWINGS

The features and advantages of the present invention will be made more evident by the following detailed description of some embodiments, described as non-limiting examples in the annexed drawings, wherein.

DETAILED DESCRIPTION

Figure 1:
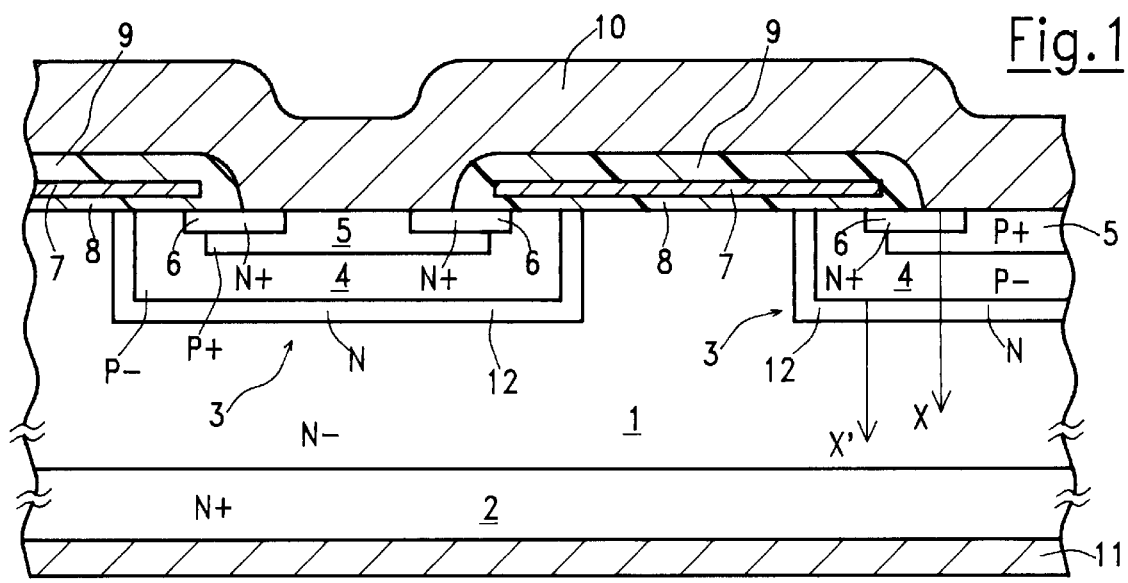
FIG. 1 is a cross-sectional view of a DMOS device structure according to a first embodiment of the present invention.

FIG. 1 is a cross-sectional view of a DMOS device structure according to the present invention, in particular Vertical Double-diffused MOSFET (VDMOSFET).

Conventionally, a lightly doped semiconductor layer 1 (drain layer) is formed over a heavily doped semiconductor substrate 2, and elementary cells 3 are formed in the lightly doped drain layer 1. The elementary cells have the structure described in the already cited U.S. Pat. No. 5,382,538, with a lightly doped body region 4 enclosing a heavily doped region 5 and an annular source region 6; the source regions 6 define, inside the respective body regions 4, a channel region. In the case of an N-channel VDMOSFET, the substrate 2, the lightly doped drain layer 1 and the source region 6 are of the N conductivity type, while the body regions 4 and the regions 5 are of the P conductivity type. In the case of a P-channel device all the conductivity types are reversed. Also, the structure can represent an Insulated Gate Bipolar Transistor (IGBT), either N- or P-channel, provided that the conductivity type of the substrate 2 is opposite to that of the lightly doped drain layer 1.

A polysilicon gate 7, insulated from the underlying semiconductor regions by a thin gate oxide layer 8, extends between adjacent elementary cells 3, and is covered by a dielectric layer 9 in which contact windows are provided over the central region of each elementary cell 3, to allow a source metal layer 10 to contact the heavily doped regions 5 and the source regions 6. Also, a drain metal layer 11 is provided at the bottom of the substrate 2.

Figure 2:
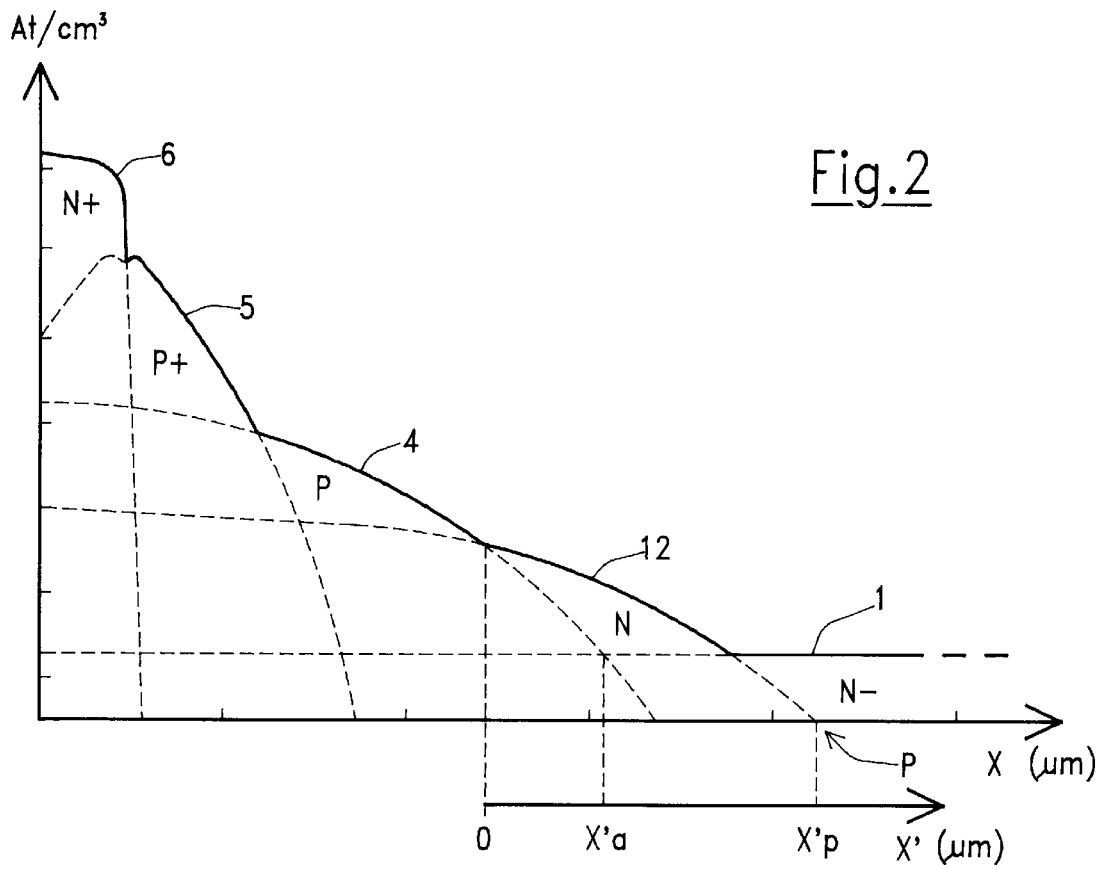
FIG. 2 is a diagram showing the doping concentration profiles of some doped semiconductor regions of the structure of FIG. 1.

The body regions 4 are enclosed within respective enhancement regions 12 of the same conductivity type as the lightly doped drain layer 1, but more heavily doped. FIG. 2 is a diagram (not to scale), showing the doping concentration profiles (expressed in log. atoms (at) per cubic centimeter) of the various doped semiconductor regions of the structure of FIG. 1, as a function of the distance x from the semiconductor surface. It can be appreciated that the concentration of N type dopants near the junction between the P type body region 4 and the drain layer 1 is higher than in conventional structures, where the enhancement regions 12 are absent.

The presence of the enhancement regions 12 around the body regions 4 has several advantages, which will be now discussed.

Firstly, the on-state resistance RDSon of the VDMOSFET is reduced. In fact, the presence of the enhancement regions 12 increases the overall amount of dopant ions in the portions of the drain layer 1 comprised between adjacent elementary cells (thus determining a reduction in the so-called Rjfet component of the RDSon), and creates a preferred path for the flow of electrons towards the substrate 2, thus determining a reduction of the so-called Rdrift component, associated to the drain layer 1, of the RDSon; the Rdrift component of RDSon, for VDMOSFETs of medium/high voltage (with breakdown voltage BVDSS>250 Volts), is the most important component.

The reduction in the Rjfet component of RDSon allows to reduce the spacing between adjacent cells, which translates in an increase of the cell density. This increases the channel length per unit area, and reduces the value of the gate-drain parasitic capacitance.

As the body junction depth is reduced, so is the channel length, and correspondingly the R channel component of the RDSon.

Figure 3:
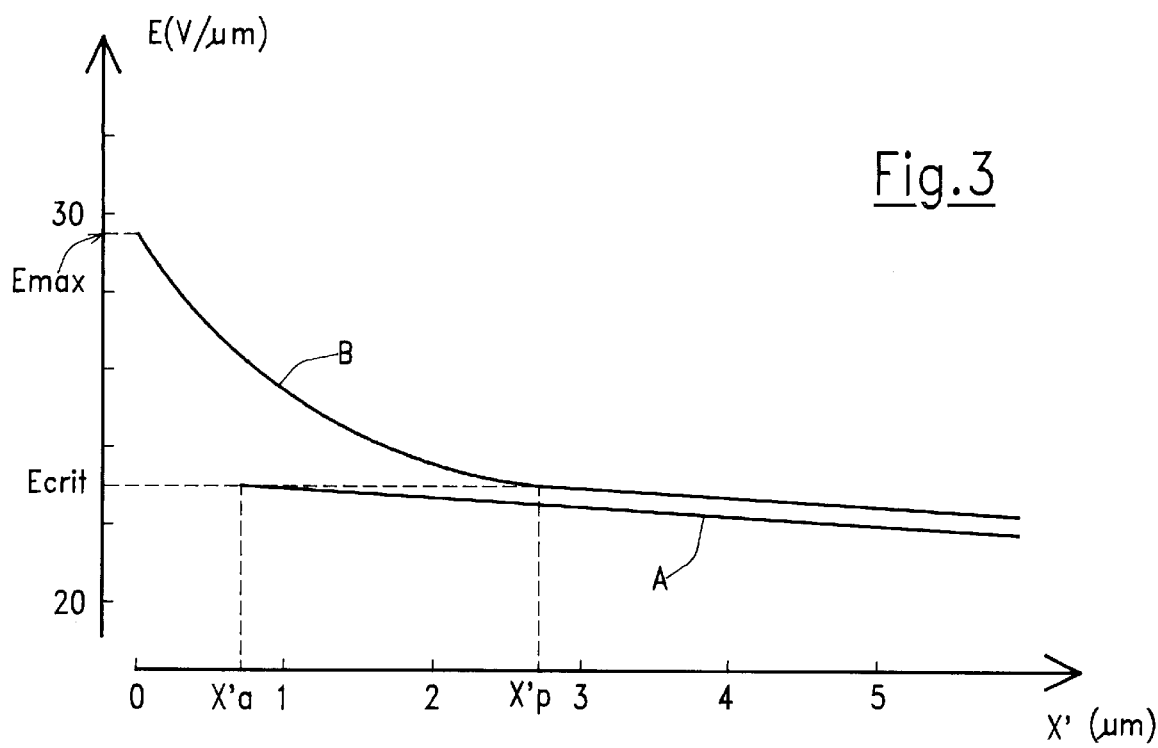
FIG. 3 is a diagram of the electric field distribution in the structure of FIG. 1 and in a conventional structure, in breakdown conditions.

Secondly, the presence of the enhancement regions 12 increases the breakdown voltage BVDSS of the VDMOSFET. This can be appreciated referring to FIG. 3. In this figure, the electric field profile along the drain region 1 at the breakdown as a function of the distance x' from the junction between the body region 4 and the drain layer 1 is shown in two different cases. Curve A refers to a conventional uniformly-doped semiconductor layer 1, with a dopant concentration of $2*10^{14}$ atoms/cm$^3$ (resistivity equal to 22 Ohms*cm), typical of a VDMOSFET with a breakdown voltage BVDSS of 500 Volts. Curve B refers to the structure of the present invention, with a semiconductor layer 1 having the same dopant concentration as in the case of curve A, but wherein enhancement regions 12 are provided.

In the case of curve A, the electric field E reaches its maximum value Ecrit (at which breakdown occurs) at the junction between the body region 4 and the drain layer 1 (x'=x'a), and then decreases linearly, with a sloped-dE/dx', moving towards the interface of the drain layer 1 with the substrate 2, where the field has the value Ecrit-W*dE/dx' (W being the thickness of the so-called "residual drain layer", i.e. the distance between the substrate 2 and the junction between the body region 4 and the drain layer 1).

In the case of the present invention, the electric field E does not decrease linearly with the distance x' from the edge of the body region 4, and is always higher than in the case of curve A. Breakdown takes place either when the electric field reaches the value Ecrit at the point P, shown in FIG. 2, where the dopant concentration of the enhancement region 12 becomes negligible compared with the dopant concentration of the drain layer 1 or when the electric field value at the body/drain junction (x'=0) exceeds the value Ecrit of the enhancement region 12, whichever occurs first. Point P is located at some microns (x'p) from the junction between the body region 4 and the enhancement region 12.

The increment $\Delta$BV in the breakdown voltage value thus obtained corresponds to the increase in the area subtended by the curve of the electric field. Approximating the portion of curve B in the region comprised between x'=0 and x'=x'p with a straight line, we obtain:

$$\Delta BV = (E\ max - Ecrit)*x'p/2 + x'p*(W-x'p)*dE/dx.$$

It is evident that, instead of having a VDMOSFET structure which, with a drain layer 1 of a given thickness, has an higher BV, it would be possible to have a VDMOSFET which, for a given value of BV, has a thinner drain layer 1, and thus a lower RDSon.

Figure 4:
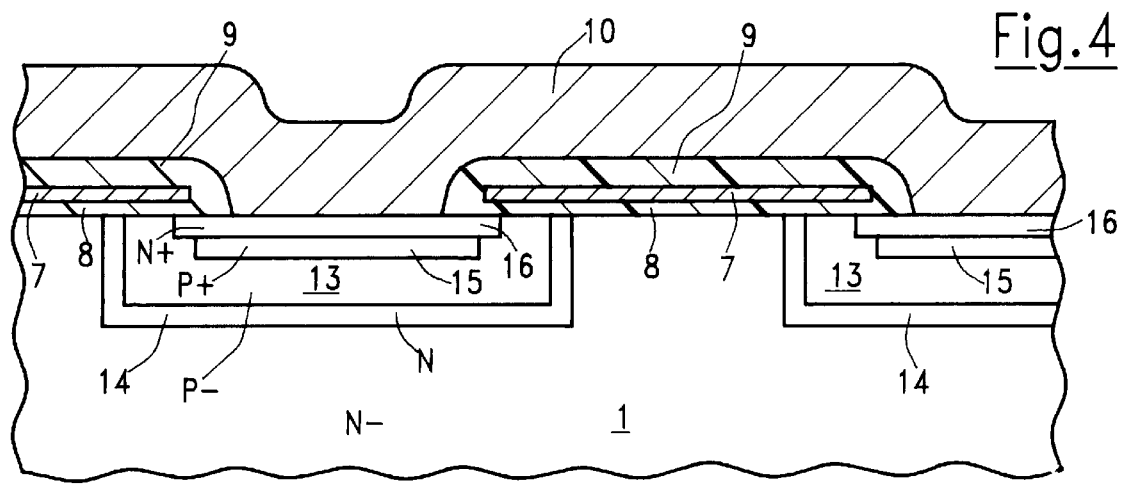
FIG. 4 is a cross-sectional view of a DMOS device structure according to a second embodiment of the present invention.

FIG. 4 shows in cross-sectional view a second embodiment of the present invention. In this embodiment, the VDMOSFET has a "stripe" structure, instead of a "cellular" one. This means that the body regions are elongated stripes 13, instead of square or hexagonal cells as in FIG. 1. Also, the heavily doped regions 5 are replaced by heavily doped stripes 15, and the source regions are represented by stripes 16; it is to be noted that with a stripe geometry, it is not necessary to provide a central area wherein the source region is absent for the contact to the heavily doped region 15: it is sufficient to provide periodical interruptions in the source stripes 16, or alternatively to merge all the heavily doped regions 15 along the periphery of the chip. In this way the integration density can be increased. As visible from FIG. 4, and according to the present invention, the body stripes 13 are formed within respective enhancement stripes 14 of the same conductivity type as the drain layer 1, but more heavily doped.

Figure 5:
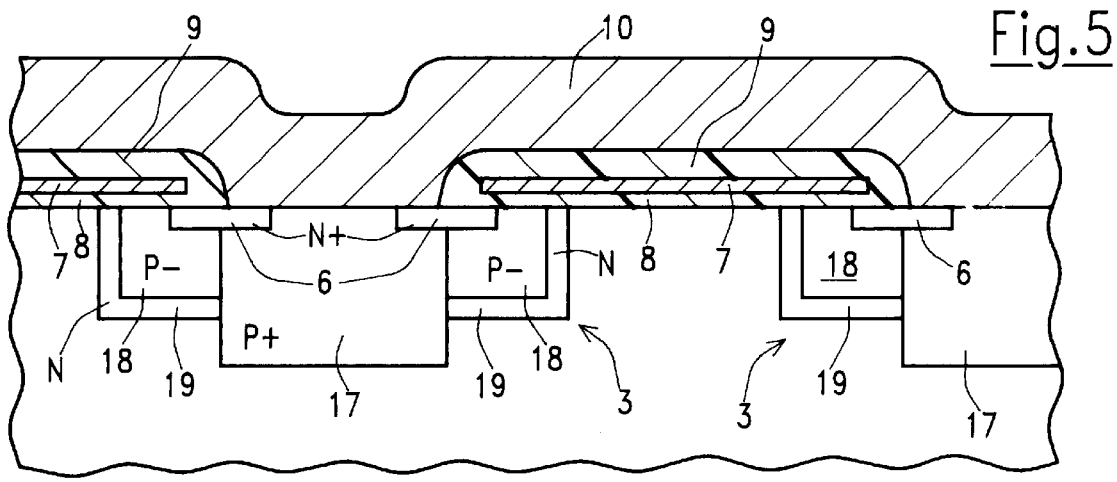
FIG. 5 is a cross-sectional view of a DMOS device structure according to a third embodiment of the present invention.

FIG. 5 shows a third embodiment of the present invention. This third embodiment relates again to a VDMOSFET with cellular structure, but in which heavily doped regions 17 deeper than body regions 18 are provided; for this reason, the heavily doped regions 17 are also called "deep body regions". The depth of enhancement regions 19 is intermediate between the depth of the deep body regions 17 and that of the body regions 18.

When compared with the structure of U.S. Pat. No. 4,974,059, there is a significant advantage in that the enhancement regions associated with each cell are clearly separated from each other, they do not extend below the entire extension of the polysilicon gate electrode 7 and thus the parasitic capacitance between gate and drain of the DMOS device is reduced.

A process for the manufacturing of a DMOS device structure according to the present invention is totally similar to the conventional processes (such as that described in the already cited U.S. Pat. No. 5,382,538, or in the above mentioned technical paper by Grant and Tregidga), except from an additional step involving an implantation of a dopant for the formation of the enhancement regions 12.

More specifically, the structures shown in FIGS. 1 and 4 can be manufactured by means of the process described in the U.S. Pat. No. 5,382,538, while the structure of FIG. 5 can be manufactured by means of the process described in the technical paper by Grant and Tregidga.

In both cases, the implantation step is performed after the definition of the polysilicon gates, and before the implantation of a dopant for the formation of the body regions 4, 13 or 18. Considering for example the case of an N-channel device, a suitable dopant for forming the enhancement regions 12, 14 or 19 is phosphorus, and the implantation dose can be of $5*10^{12}$ ions/cm2. A thermal diffusion process is performed after the implantation of phosphonousions. Alternatively, it is possible to perform a unique thermal diffusion process after the implantation of the P type dopant (boron) for the formation of the body regions, taking advantage of the higher diffusivity of phosphorus with respect to boron to obtain body regions enclosed within the enhancement regions. The enhancement regions are self-aligned with the polysilicon gates.

The enhancement regions 12, 14 or 19 can be defined selectively, by means of known photolithographic techniques, or non-selectively, with the polysilicon gates and the field oxide (not shown in the drawings) preventing the formation of enhancement regions in regions different from the elementary cells 3 or stripes 13.

The DMOS structure of the present invention can be used not only in discrete devices, but also in Power Integrated Circuits (PICs).

Having thus described at least one illustrative embodiment of the invention, various alterations, modifications, and improvements will readily occur to those skilled in the art. Such alterations, modifications, and improvements are intended to be within the spirit and scope of the invention.

Accordingly, the foregoing description is by way of example only and is not intended as limiting. The invention is limited only as defined in the following claims and the equivalents thereto.

What is claimed is:

1. Process for the manufacturing of a DMOS device, comprising the steps of forming a lightly doped semiconductor layer of a first conductivity type over a heavily doped semiconductor substrate, forming a gate oxide layer over the lightly doped semiconductor layer, forming a conductive gate layer over the gate oxide layer, selectively removing the conductive gate layer to define conductive insulated gates, forming lightly doped semiconductor regions of a second conductivity type in a self-aligned manner with said conductive insulated gates, wherein before forming said lightly doped semiconductor regions, it provides for forming enhancement regions of the same conductivity type as but with a lower resistivity than said lightly doped semiconductor layer, said enhancement regions being formed in a self-aligned manner with said conductive insulated gates.

2. Process according to claim 1, wherein after the definition of said conductive insulated gates, it provides for implanting a first dopant of the first conductivity type, thermally diffusing said first dopant to form the enhancement regions, implanting a second dopant of the second conductivity type, and thermally diffusing the second dopant to form the lightly doped semiconductor regions inside respective enhancement regions.

3. Process according to claim 1, wherein after the definition of said conductive insulated gates, it provides for implanting a first dopant of the first conductivity type, implanting a second dopant of the second conductivity type, the first dopant having a higher diffusivity than the second dopant, and thermally diffusing the first and second dopant to form the lightly doped semiconductor regions contained in the enhancement regions.

4. Process according to claim 2, wherein the implant of said first dopant of said first conductivity type is performed selectively.

5. Process according to claim 2, wherein the implant of said first dopant of said first conductivity type is performed without performing additional photolithographic steps for defining additional patterns.

6. Process according to claim 3, wherein the implant of said first dopant of said first conductivity type is performed selectively.

7. Process according to claim 3, wherein the implant of said first dopant of said first conductivity type is performed without performing additional photolithographic steps for defining additional patterns.

* * * * *

UNITED STATES PATENT AND TRADEMARK OFFICE
CERTIFICATE OF CORRECTION

PATENT NO. : 6,218,228 B1
DATED : April 17, 2001
INVENTOR(S) : Raffaele Zambrano Page 1 of 1

It is certified that error appears in the above-identified patent and that said Letters Patent is hereby corrected as shown below:

<u>Title page,</u>
First paragraph should read as shown below:

This application is a division of application Ser. No. 08/622,695, filed Mar. 26, 1996 now U.S. Pat. No. 5,838,042, entitled DMOS DEVICE STRUCTURE, AND RELATED MANUFACTURING PROCESS now pending.

Signed and Sealed this

First Day of January, 2002

Attest:

JAMES E. ROGAN
*Attesting Officer*     *Director of the United States Patent and Trademark Office*